United States Patent [19]
Pascucci et al.

[11] Patent Number: 5,659,498
[45] Date of Patent: Aug. 19, 1997

[54] UNBALANCED LATCH AND FUSE CIRCUIT INCLUDING THE SAME

[75] Inventors: Luigi Pascucci, Sesto San Giovanni; Paolo Rolandi, Volpedo; Antonio Barcella, Trescore Balneario; Marco Fontana, Milan, all of Italy

[73] Assignee: SGS-Thomson Microelectronics S.r.l., Agrate Brianza, Italy

[21] Appl. No.: 684,406

[22] Filed: Jul. 19, 1996

[30] Foreign Application Priority Data

Jul. 28, 1995 [EP] European Pat. Off. .............. 95830337

[51] Int. Cl.$^6$ ........................................................ G11C 11/00
[52] U.S. Cl. ........................................ 365/154; 365/189.05
[58] Field of Search .............................. 365/154, 189.05, 365/205

[56] References Cited

U.S. PATENT DOCUMENTS

| | | | |
|---|---|---|---|
| 3,848,236 | 11/1974 | Troutman | 340/173 R |
| 4,195,239 | 3/1980 | Suzuki | 307/355 |
| 4,669,063 | 5/1987 | Kirsch | 365/189 |
| 4,811,290 | 3/1989 | Watanabe | 365/149 |
| 5,063,537 | 11/1991 | Akrout et al. | 365/96 |
| 5,294,819 | 3/1994 | Simko | 257/314 |

FOREIGN PATENT DOCUMENTS 0205294  12/1986  European Pat. Off.  ........ G11C 11/24

Primary Examiner—David C. Nelms
Assistant Examiner—Hien Nguyen
Attorney, Agent, or Firm—Wolf, Greenfield & Sacks, P.C.; James H. Morris

[57] ABSTRACT

A latch circuit that is intentionally unbalanced, so that a first output reaches ground voltage and a second output reaches a supply voltage. The latch circuit may be used with a fully static low-consumption fuse circuit which reverses the first and second outputs of the latch circuit when the fuse is in an unprogrammed state, but does not change the outputs of the latch circuit in the programmed state. In particular, the latch circuit has a first transistor of a first polarity series connected at a first output node with a second transistor of a second polarity between a supply voltage and a ground voltage. A third transistor of the first polarity is series connected at a second output node with a fourth transistor of the second polarity between the supply voltage and the ground voltage. The gate terminals of the first and second transistors are connected to the second output, while the gate terminals of the third and fourth transistors are connected to the first output. The first and third transistors have thresholds which are mutually different, and the second and fourth transistors have thresholds which are mutually different, so that the first output reaches ground voltage and the second output reaches the supply voltage. This circuit can be combined with a fuse circuit, such as a dual gate transistor.

8 Claims, 3 Drawing Sheets

UNBALANCED LATCH AND FUSE CIRCUIT INCLUDING THE SAME

BACKGROUND OF THE INVENTION

1. Field of the Invention

The present invention relates to an unbalanced latch and to a fully static low-consumption fuse circuit including such a latch.

2. Discussion of the Related Art

It is known that a static RAM cell or any element of a register that can be implemented in microprocessors requires an appropriate presetting circuit when the device is switched on. Therefore, a static RAM must have a predictable initial memorization state, obtained by pre-memorizing information in the individual cells that constitute the RAM memory.

During manufacture, each cell is preset so as to represent a binary zero or one, so that during operation the state of the cell can switch in order to store binary information.

As already mentioned, in order to pre-memorize binary information in RAM cells it is necessary to have an appropriate presetting circuit. Such a circuit is a drawback because it increases the size of the circuit.

On the other hand, that it is well-known nonvolatile memories of the EPROM, EEPROM, and FLASH types, use fuses having the purposes of storing events and providing programmable configurations. In redundancy circuits, the fuses are used to store the address of the memory line that is replaced with the redundancy circuit.

Static fuses are furthermore used for the configuration of integrated circuits in a nonvolatile manner, in which they can assume switching properties. Another application of fuses is the programming of delays and jumps in a nonvolatile manner.

A drawback of known fuses is that they are relatively complicated and occupy a considerable portion of silicon on an integrated circuit due to the number of components used.

Another drawback is that the fuses are protected against accidental programming, known as "soft-writing", in a complicated manner.

Furthermore, when a fuse not yet programmed, called a "virgin" state, it has a considerable consumption. This consumption, multiplied by the number of fuses provided in an integrated circuit, is not negligible.

SUMMARY OF THE INVENTION

A general aim of the present invention is to reduce the size of circuitry for presetting a latch while also reducing consumption. In one aspect of the invention, this aim is achieved by combining an unbalanced latch that can be used as an element which can be preset automatically at in a definite state with a fully static low-consumption fuse.

Accordingly, one object of the present invention is to provide a fully static low-consumption fuse circuit that structurally is simpler than known fuses, for example, having a smaller number of components or by having a single programmable element.

Another object of the present invention is to provide a fully static low-consumption fuse that is protected against accidental programming, known as soft-writing.

Another object of the present invention is to provide a fully static low-consumption fuse circuit capable of performing static reading, without particular reading circuits.

Another object of the present invention is to provide a fully static low-consumption fuse circuit that is consumption-free after a decision step has occurred.

Another object of the present invention is to provide a fully static low-consumption fuse circuit that avoids any control circuits.

The foregoing other objects and advantages of the invention are achieved by a latch circuit, which is unbalanced. This latch circuit has a first transistor of a first polarity series connected at a first output node with a second transistor of a second polarity between a supply voltage and a ground voltage. A third transistor of the first polarity is series connected at a second output node with a fourth transistor of the second polarity between the supply voltage and the ground voltage. The gate terminals of the first and second transistors are connected to the second output, while the gate terminals of the third and fourth transistors are connected to the first output. The first and third transistors have thresholds which are mutually different, and the second and fourth transistors have thresholds which are mutually different, so that the first output reaches ground voltage and the second output reaches the supply voltage. More particularly, the first transistor has a high threshold, such as 1.7 volts, and the second transistor has a low threshold, such as 0.3 volts. The fourth transistor has a medium threshold, such as 0.8 volts. The third transistor has a threshold different from the first transistor, for example, 0.9 volts.

In this latch circuit, the first transistor has a drain terminal connected to the supply voltage and the second transistor has a source terminal connected to the ground voltage. Similarly, the third transistor has a drain terminal connected to the supply voltage and the fourth transistor has a source terminal connected to the ground voltage.

The latch circuit may also include an N-type diffusion first capacitor connected between the first output and the ground voltage, and a P-type diffusion second capacitor connected between the second output and the ground voltage.

Another aspect of this invention is the combination of such an unbalanced latch circuit with a fully static, low-consumption fuse circuit. In particular, a fuse is connected to an unbalanced latch circuit having a first output and a second output. The fuse has a programmed state in which the first output of the unbalanced latch circuit is at a ground voltage and the second output of the unbalanced latch circuit is at a supply voltage. The fuse also has a virgin state in which the second output of the unbalanced latch circuit is at the ground voltage and the first output of the unbalanced latch circuit is at the supply voltage.

In one embodiment, the static fuse circuit also includes a current source connected to the fuse for inducing a programming current in the fuse. This current source may be, for example, a transistor. In one embodiment, the fuse is a dual-gate transistor which has a gate connected to the supply voltage, and a threshold above the supply voltage when both the programming current and a voltage at least equal to the supply voltage are applied to the fuse.

In another embodiment, the fuse is a dual-gate transistor having a gate connected to the supply voltage and a drain. The fuse may also have a cascading transistor for maintaining the voltage on the drain of the dual-gate transistor for avoiding accidental programming of the dual-gate transistor. The dual-gate transistor typically has a higher threshold than the high threshold of the first transistor of the latch circuit. In yet another embodiment, the static fuse circuit includes a voltage source interposed between the source of the dual-gate transistor and the ground voltage for unprogramming of the dual-gate transistor.

In another embodiment, the static fuse circuit includes a presetting element connected between the first output and the ground voltage. This presetting element may be a transistor.

In yet another embodiment, the static fuse circuit includes an N-diffusion capacitor interposed between the first output and the ground voltage and a P-diffusion capacitor interposed between the second output and the supply voltage.

Another aspect of the invention is a memory including a plurality of static memory cells, such as in a static random access memory (RAM) or in a register in a microprocessor. The static memory cells include a latch circuit in accordance with this invention. Another aspect of the invention is a non-volatile memory having a plurality of memory cells containing the latch circuit and fuse in accordance with the invention.

BRIEF DESCRIPTION OF THE DRAWINGS

The characteristics and advantages of the invention will become apparent from the description of a preferred but not exclusive embodiment thereof, illustrated by way of non-limiting example only in the accompanying drawings, wherein.

DETAILED DESCRIPTION

Figure 1:
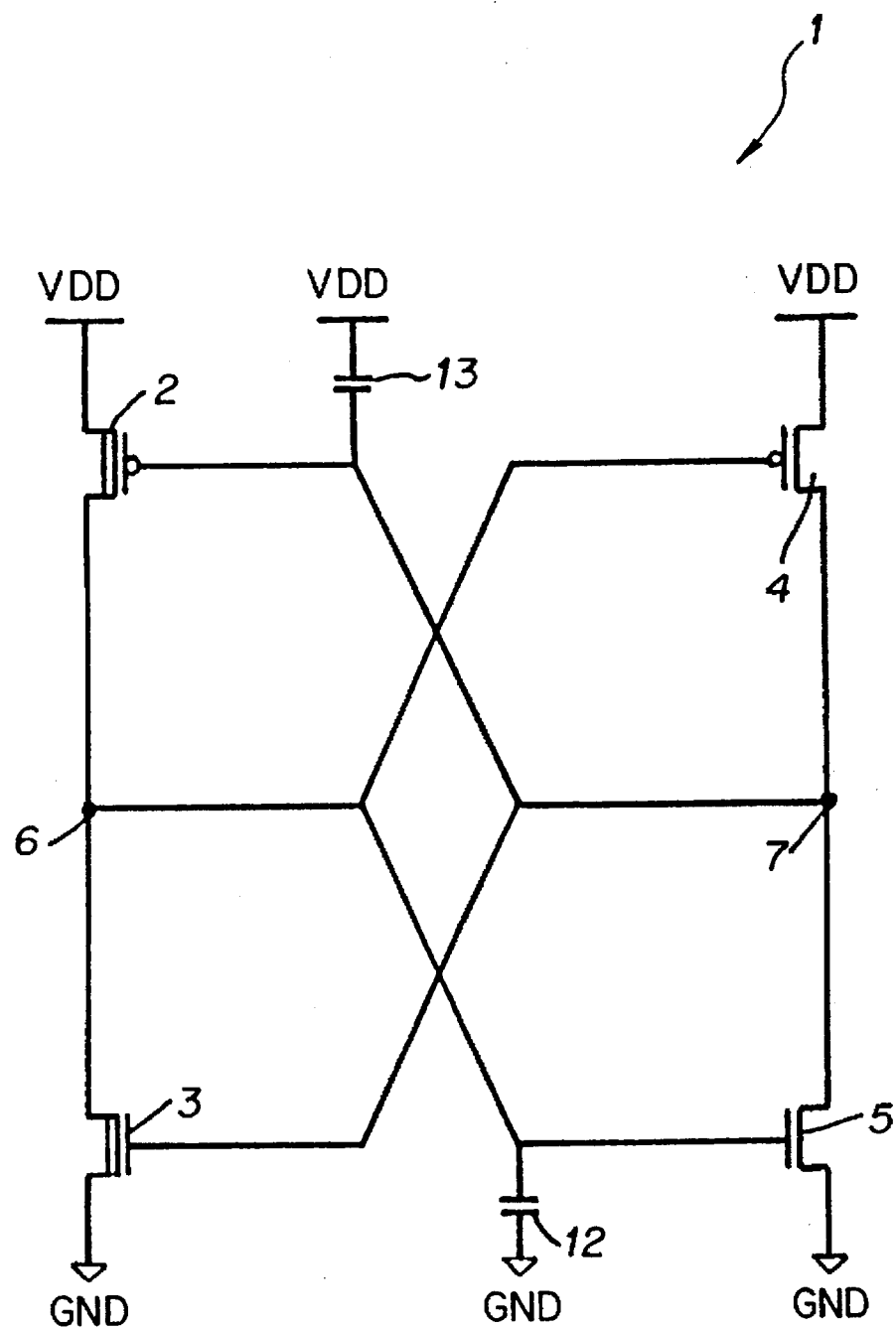
FIG. 1 is a diagram of an unbalanced latch circuit according to one embodiment of the invention.

Referring to FIG. 1, the latch circuit according to one embodiment of the present invention comprises a first transistor 2 of the native P-channel type with a high threshold, on the order of 1.7 V. The drain of the transistor 2 is connected to a supply voltage $V_{DD}$, whereas the source is connected to the drain of a second transistor 3 of the native N-channel type having a low threshold (on the order of 0.3 V). The source of the second transistor 3 is connected to ground (GND).

The latch circuit 1 furthermore comprises a third transistor 4 of the P-channel LVS (Light Voltage Shift) corrected-threshold type having an average threshold on the order of 0.9 V. The drain terminal of the third transistor 4 is connected to the supply voltage $V_{DD}$, whereas the source terminal is connected to a fourth transistor 5 of the N-channel LVS type with corrected threshold (typically 0.8 V, higher than the corresponding transistor 3). The source terminal of the fourth transistor 5 is connected to ground (GND).

A first node 6 on the line that connects the first transistor 2 and the second transistor 3 is connected to the gates of both the third transistor 4 and the fourth transistor 5. Likewise, on the line that connects the third transistor 4 and the fourth transistor 5 a second node 7 is connected to the gates of both the first transistor 2 and the second transistor 3.

In this manner, the first four transistors 2–5 form a classic latch structure, which is intentionally unbalanced due to the different thresholds so that when the supply voltage $V_{DD}$ switches on, the first node 6 tends to reach the ground value GND, whereas the second node 7 tends to reach the value of the supply voltage $V_{DD}$.

In order to facilitate the operation of the latch structure, a first capacitor 12 is connected between the first node 6 and ground GND. The first capacitor may be provided in N-type diffusion. A second capacitor 13 is also provided, in P-type diffusion, and is interposed between the second node 7 and the supply voltage $V_{DD}$.

Figure 2:
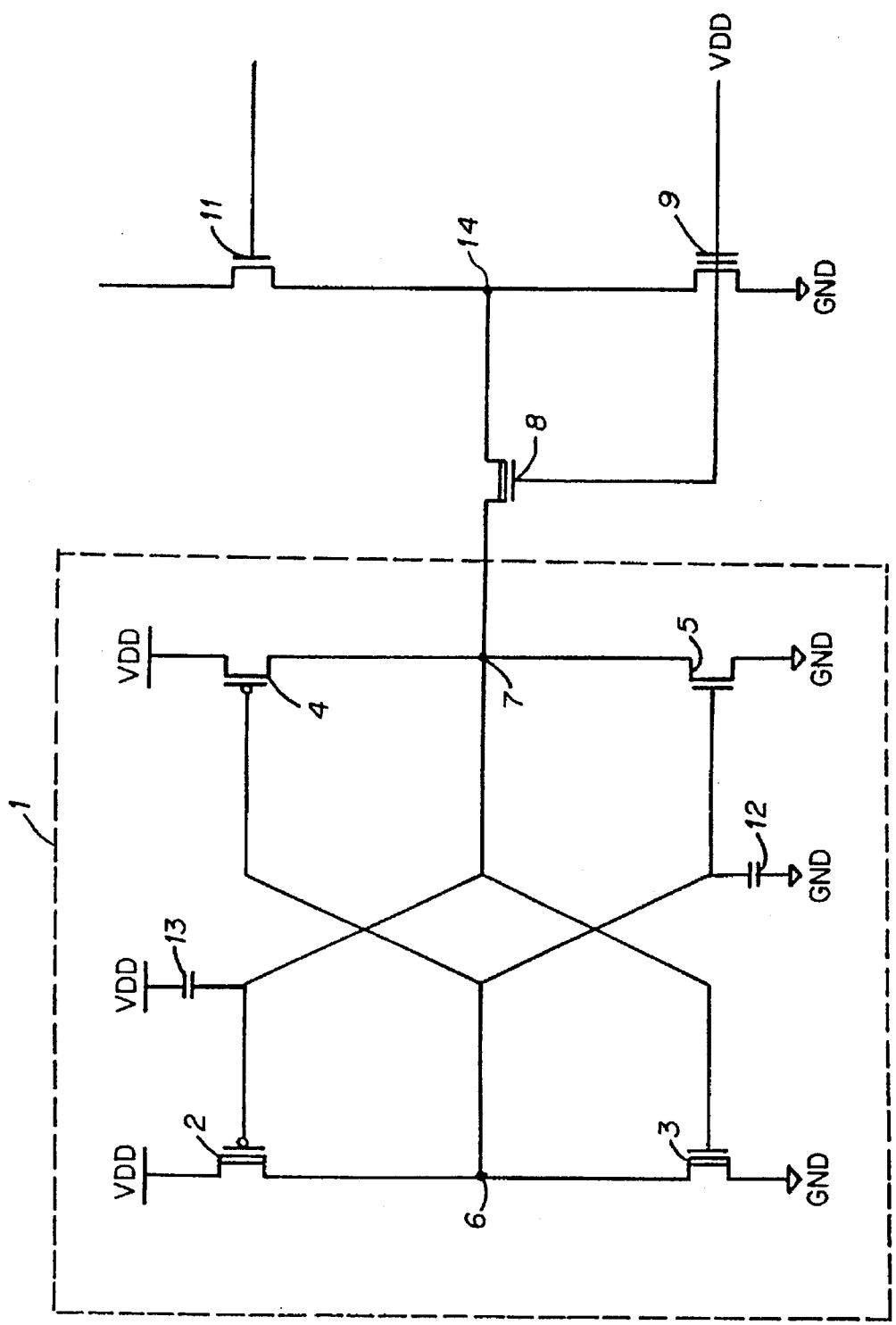
FIG. 2 is a diagram of a first embodiment of a fuse circuit according to the invention, comprising the unbalanced latch shown in FIG. 1.

FIG. 2 is a diagram of a first embodiment of the combination of an unbalanced latch circuit, such as shown in FIG. 1, and a fully static fuse circuit. In FIG. 2, a reversing branch is connected to the second node 7 of the latch circuit 1 and is comprised of a fifth cascoding transistor 8 of the native N-channel type with a low threshold (on the order of 0.3 V), which is series-connected to the drain terminal of a sixth dual-gate transistor 9 of the nonvolatile N-channel type. Transistor 8 is not indispensable for the operation of the circuit but has the purpose of adjusting the voltage on the drain of the transistor 9. The sixth transistor 9 has a high threshold (approximately 2.1 V) and acts as a fuse for the circuit. That is, transistor 9 is programmable. The other terminal (the source terminal) of the nonvolatile transistor 9 is connected to ground.

The gate terminals of transistors 8 and 9 are connected to the supply voltage $V_{DD}$. In this manner, when the supply voltage $V_{DD}$ reaches the threshold of the nonvolatile transistor 9, the transistors 8 and 9 are switched on and the second node 7 is connected to ground (GND), whereas the first node 6, due to the latch structure, is connected to the supply voltage $V_{DD}$.

The nonvolatile transistor 9 is series-connected to a programming branch comprised of an LVS N-channel transistor 11 with an average threshold on the order of 0.8 V. Transistor 11, when biased appropriately, acts as a current source during programming.

The operation of the latch circuit according to this embodiment is as follows. When the supply voltage $V_{DD}$ is switched on, the first node 6 of the latch circuit 1 tends to remain at the ground (GND), since the low-threshold transistor 3 starts to conduct, and the second node 7 tends to reach the supply voltage $V_{DD}$. In this manner, the latch circuit 1 presets itself, when it switches on, in a definite state by virtue of the imbalance obtained by differentiating the thresholds of the two N-type transistors and the thresholds of the two P-type transistors.

The reason why the thresholds of the P-type transistors are mutually different, like the thresholds of the N-type transistors, can be more clearly understood by observing FIG. 1. If the reverse junction current of the P-type transistors 1 and 3 is higher than the reverse current of the N-type transistors 2 and 4, at power-on the two nodes 6 and 7 of the latch circuit 1 are at a voltage equal to the supply voltage. When the voltage reaches the threshold voltage of the native N-type transistor 3, the node 6 discharges to ground (GND). If instead the reverse junction current of the P-type transistors 1 and 3 is lower than the reverse junction current of the N-type transistors 2 and 4, then at power-on both nodes 6 and 7 of the latch circuit 1 are connected to ground (GND). As soon as the power supply reaches a voltage equal to the threshold voltage of the P-type transistor 4, the node 7 becomes charged at the supply voltage $V_{DD}$. In both of these cases, the latch circuit 1 is in a definite and univocal state.

The operation of the fuse circuit shown in FIG. 2, which includes the latch of FIG. 1, is similar for the first power-on step. Then, at approximately 2.1 V, the nonvolatile transistor 9 switches on (whereas the transistor 8 is already on when $V_{DD}$=0.5 V) and the operation of the latch circuit 1 is reversed. That is, the second node 7 is connected to ground GND and the first node is connected to the supply voltage $V_{DD}$.

The threshold values and the internal resistances of the transistors 4, 8, and 9 and the value of the capacitor 13 (which is connected to the node 7) are chosen so that the voltage at the node 14 connected to the drain of the nonvolatile transistor 9 never exceeds a value of approximately 1 V. In this manner, dangerous voltages at the drain of the nonvolatile transistor 9, which might accidentally program the transistor, are avoided.

During programming, a high voltage of approximately 12 V is applied to the gates of both the nonvolatile transistor 9 and the transistor 8. A high voltage of approximately 12 V is also applied to the gate of the programming transistor 11, whereas a voltage on the order of $V_{DD}$ is applied to its drain. The high voltage at the gate of the transistor 11 has the purpose of inducing an intense programming current in the nonvolatile transistor 9. This is necessary only for EPROM and FLASH memories, whereas for EEPROM memories it is sufficient to have a high voltage at the gate of the nonvolatile transistor.

With a high voltage applied to the gate and an intense current present across the drain/source terminals, the floating gate of the transistor 9 is charged and its threshold rises to 6–7 V, i.e., above the value of $V_{DD}$ that is normally applied to the gate of the transistor 9.

In this manner, once it has been programmed, the transistor 9, by having a voltage $V_{DD}$ applied to its gate, no longer conducts and does not draw the second node towards ground (GND). In this manner, the second node 7 reaches $V_{DD}$, as defined by the unbalanced latch circuit 1, and the first node 6 reaches ground (GND).

During reading, the voltage at the drain of the programming transistor 11 can have any value, but the voltage on its gate must be equal to 0 V so that it does not conduct current. During reading, the output values can be taken both from the first node 6 and from the second node 7.

Figure 3:
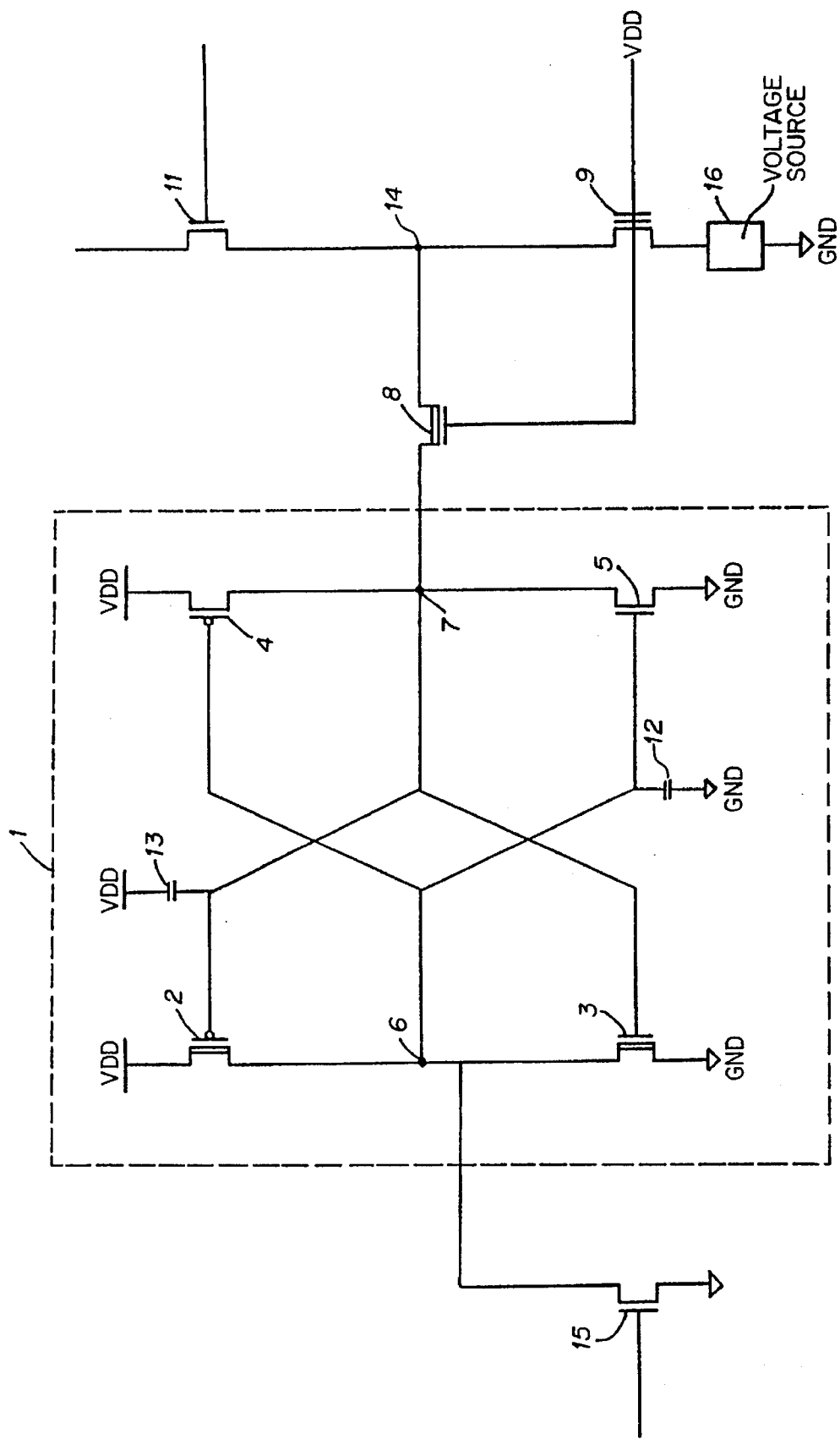
FIG. 3 is a diagram of a second embodiment of a fuse circuit according to the present invention, including the unbalanced latch shown in FIG. 1.

FIG. 3 is a diagram of a second embodiment of a fully static fuse circuit.

The circuit of FIG. 3 is substantially identical to the circuit of FIG. 2, with the first difference that it comprises a forced presetting transistor 15 connected between the first node 6 and ground (GND). Transistor 15 induces presetting of the latch circuit 1. That is, transistor 15 connects the first node to ground and the second node to $V_{DD}$ when it is necessary to facilitate presetting at the initial instant of the activation of the circuit and to force presetting whenever this is desired.

The second difference with respect to the embodiment of FIG. 2 is that a voltage source 16 is interposed between the nonvolatile transistor 9 and ground. This voltage source 10 adjusts the voltage at the source of the nonvolatile transistor 9 during programming and during deletion of the programming of the circuit.

For EPROM memories, the voltage source 16 maintains the voltage at the source of the transistor 9 always at ground (GND).

For FLASH memories, the voltage source 16 maintains the voltage at the source of the transistor 9 at ground (GND) during programming and during reading, whereas during deletion it generates a high voltage of approximately 12 V, and a voltage of 0 V is applied to the gate of the transistor 9. In this manner, the floating gate of the transistor 9 discharges and the transistor 9 returns to the virgin state.

For EEPROM memories, the source of the transistor 9 is maintained at ground voltage during reading and floats during programming. Deletion occurs in a manner that is similar to deletion in FLASH memories.

Such intentionally unbalanced latch circuit, can be, for example, a static RAM cell that can be preset automatically at power-on in a definite state, without requiring a specifically provided external presetting circuit. In order to achieve this, it is sufficient to mutually differentiate the thresholds of the two N-type transistors and the thresholds of the two P-type transistors.

The unbalanced latch circuit also permits use of a fully static fuse circuit that is simpler and has a smaller number of components than known circuits. This fuse circuit furthermore requires only one programmable element, e.g., the transistor 9.

Furthermore, the nonvolatile transistor 9 is protected against soft-writing in a simple manner by means of the transistor 8.

The circuit furthermore performs static reading, and does not require particular read circuits or any control circuits.

The circuit is also consumption-free after the decision step has occurred.

In other embodiments of these circuits, for example, the polarities of the transistors can be reversed and it is possible to use any current source instead of the transistor 11. Furthermore, even if the transistors shown are of the MOSFET type, they might also be of other kinds.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended to be limiting. The invention is limited only as defined in the following claims and equivalents thereto.

What is claimed is:

1. A latch circuit, comprising:
   a first transistor of a first polarity series connected at a first output node with a second transistor of a second polarity between a supply voltage and a ground voltage;
   a third transistor of the first polarity series connected at a second output node with a fourth transistor of the second polarity between the supply voltage and the ground voltage;
   wherein the first and second transistors have a gate terminal connected to the second output;
   wherein the third and fourth transistors have a gate terminal connected to the first output;
   wherein the first and third transistors have thresholds which are mutually different, and the second and fourth transistors have thresholds which are mutually different, so that the first output reaches ground voltage and the second output reaches the supply voltage.

2. The latch circuit of claim 1, wherein the first transistor has a high threshold and the second transistor has a low threshold.

3. The latch circuit of claim 2, wherein the first transistor has a drain terminal connected to the supply voltage and the second transistor has a source terminal connected to the ground voltage.

4. The latch circuit of claim 2, wherein the fourth transistor has a threshold between the thresholds of the first and second transistors.

5. The latch circuit of claim 4, wherein the third transistor has a drain terminal connected to the supply voltage and the fourth transistor has a source terminal connected to the ground voltage.

6. The latch circuit of claim 1, further comprising an N-type diffusion first capacitor connected between the first output and the ground voltage.

7. The latch circuit of claim 6, further comprising a P-type diffusion second capacitor connected between the second output and the ground voltage.

8. A memory device including a plurality of memory cells, wherein each memory cell incorporates a latch circuit comprising:

a first transistor of a first polarity series connected at a first output node with a second transistor of a second polarity between a supply voltage and a ground voltage;

a third transistor of the first polarity series connected at a second output node with a fourth transistor of the second polarity between the supply voltage and the ground voltage;

wherein the first and second transistors have a gate terminal connected to the second output;

wherein the third and fourth transistors have a gate terminal connected to the first output;

wherein the first and third transistors have thresholds which are mutually different, and the second and fourth transistors have thresholds which are mutually different, so that the first output reaches ground voltage and the second output reaches the supply voltage.

* * * * *